(12) United States Patent
Murai et al.

(10) Patent No.: US 8,669,571 B2
(45) Date of Patent: Mar. 11, 2014

(54) LIGHT DISTRIBUTION CONTROLLER, LIGHT-EMITTING DEVICE USING THE SAME, AND METHOD FOR FABRICATING LIGHT DISTRIBUTION CONTROLLER

(75) Inventors: Akihiko Murai, Osaka (JP); Masahiro Kume, Kagoshima (JP); Akiko Nakamura, Kyoto (JP); Tooru Aoyagi, Kagoshima (JP); Kiyoshi Fujihara, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/701,998

(22) PCT Filed: Jul. 4, 2011

(86) PCT No.: PCT/JP2011/003820
§ 371 (c)(1),
(2), (4) Date: Dec. 4, 2012

(87) PCT Pub. No.: WO2012/004975
PCT Pub. Date: Jan. 12, 2012

(65) Prior Publication Data
US 2013/0075776 A1 Mar. 28, 2013

(30) Foreign Application Priority Data
Jul. 7, 2010 (JP) ................................. 2010-154581

(51) Int. Cl.
*H01L 33/00* (2010.01)
(52) U.S. Cl.
USPC ....... 257/95; 257/E33.073; 362/333; 362/334
(58) Field of Classification Search
USPC ............ 257/E33.073, 95; 362/333, 334, 311
See application file for complete search history.

(56) References Cited

U.S. PATENT DOCUMENTS

| 7,390,109 | B2 | 6/2008 | Li et al. | |
| 2006/0083000 | A1* | 4/2006 | Yoon et al. | 362/311 |
| 2006/0087863 | A1 | 4/2006 | Choi et al. | |
| 2006/0131522 | A1 | 6/2006 | Choi et al. | |
| 2006/0164838 | A1 | 7/2006 | Park et al. | |
| 2006/0208269 | A1 | 9/2006 | Kim et al. | |
| 2008/0198597 | A1 | 8/2008 | Blumel | |
| 2010/0259706 | A1 | 10/2010 | Kuwaharada et al. | |

FOREIGN PATENT DOCUMENTS

| JP | 2001-257381 | 9/2001 |
| JP | 2006-114863 | 4/2006 |

(Continued)

OTHER PUBLICATIONS

International Search Report mailed Jul. 26, 2011 issued in corresponding International Application No. PCT/JP2011/003820.

*Primary Examiner* — Zandra Smith
*Assistant Examiner* — Paul Patton
(74) *Attorney, Agent, or Firm* — McDermott Will & Emery LLP

(57) ABSTRACT

A light distribution controller of a light-emitting device includes a first optical member formed of ZnO disposed over an LED interposing a transparent adhesive, and a second optical member which covers the first optical member. The first optical member includes a first concave portion having an opening in a regular hexagon shape whose area gradually increases. In the first concave portion, inner wall surfaces having inclined surfaces, each of whose bases is formed by one side of the hexagon of the opening shape, are formed. Outside of the first optical member, outer wall surfaces each having a trapezoidal shape are formed. The second optical member includes a second concave portion arranged so that light at an annular peak in the light distribution characteristic of the light traveled through the first optical member is totally reflected.

9 Claims, 11 Drawing Sheets

(56) References Cited

FOREIGN PATENT DOCUMENTS

| | | |
|---|---|---|
| JP | 2006-210315 | 8/2006 |
| JP | 2006-261663 | 9/2006 |
| JP | 2009-510678 | 3/2009 |
| WO | WO-2009/157166 | 12/2009 |

\* cited by examiner (A)

(B)

(C)

(D)

(E)

(F)

(G)

(A)

(B)

(C)

(D)

(A)

(B)

LIGHT DISTRIBUTION CONTROLLER, LIGHT-EMITTING DEVICE USING THE SAME, AND METHOD FOR FABRICATING LIGHT DISTRIBUTION CONTROLLER

RELATED APPLICATIONS

This application is the U.S. National Phase under 35 U.S.C. §371 of International Application No. PCT/JP2011/003820, filed on Jul. 4, 2011, which in turn claims the benefit of Japanese Application No. 2010-154581, filed on Jul. 7, 2010, the disclosures of which Applications are incorporated by reference herein.

TECHNICAL FIELD

The present disclosure relates to light distribution controllers, light-emitting devices using the same, and a method for fabricating the light distribution controllers.

BACKGROUND ART

In recent years, light-emitting devices including semiconductor light-emitting elements (LEDs) having a small size, a long life, and low power consumption have been used for various lighting applications. In addition, light-emitting devices which emit white light by combining an LED and a fluorescent material, which absorbs the light from the LED, and can generate light having a long frequency therefrom by frequency conversion, have been widely developed and commercially produced. Such light-emitting devices which can emit white light are rapidly becoming commonplace as backlight sources in liquid crystal display (LCD) panels of flat-screen LCD televisions.

Such a use as a backlight source requires the light-emitting devices not only to achieve a small size and high brightness, but also to provide a broad light distribution characteristic so as to emit uniform white light in a broader range. Likewise, a similar need exists in the field of general lighting.

Conventionally, technologies for implementing a broad light distribution characteristic in a backlight source are disclosed in, for example, Patent Documents 1-3.

Patent Document 1 discloses a configuration in which a light direction-changing unit having a V-shaped center is provided over an LED, and light from the LED is reflected at an inner wall surface of the indentation, allowing the light to be output in transverse directions. Patent Document 1 discloses one example of the light distribution characteristic of such a configuration, which is as wide as approximately 140°.

As another measure to provide a broad light distribution characteristic, Patent Document 2 discloses a configuration of a light distribution lens having a particular shape. Patent Document 2 describes that this lens can achieve a light distribution characteristic of an angle greater than or equal to 170°. In addition, Patent Document 3 discloses a measure to achieve a broad light distribution characteristic by using a light-scattering material in addition to a lens. The configuration is such that an optical member having a similar shape to that of Patent Document 1 is provided over an LED, and a light-scattering layer containing a light-scattering material is formed on the V-shaped center of the optical member. The light-scattering layer scatters the light escaping from the LED to above the optical member, thereby increasing the light output component in transverse directions.

CITATION LIST

Patent Document

PATENT DOCUMENT 1: U.S. Pat. No. 7,390,109
PATENT DOCUMENT 2: Japanese Patent Publication No. 2006-210315
PATENT DOCUMENT 3: Japanese Patent Publication No. 2006-261663

SUMMARY OF THE INVENTION

Technical Problem

However, the technology disclosed in Patent Document 1 results in excessively high intensity of light in the straight upward direction, and therefore the light distribution characteristic provided is not sufficiently broad. Moreover, the intensity of the light projected onto the planar light control member at a constant distance from the LED is not sufficiently uniform. Although the configuration disclosed in Patent Document 2 achieves a broad light distribution characteristic, the lens has a complex shape and is large in size, and thus it is difficult to achieve a reduction in the thickness as required for a backlight source. In general, it is difficult to achieve, by a lens having a simple shape, broad light distribution from Lambertian light distribution, which has a light distribution characteristic of a planar light-emitting source, and at the same time to reduce the light intensity at the center. The configuration disclosed in Patent Document 3 improves the light distribution characteristic as compared to that of Patent Document 1 by additionally using a light-scattering material. However, since the light-scattering material itself absorbs the light, the light-output efficiency is reduced. Moreover, variations occur during application of the light-scattering material in small regions, that is, the concave portions of the lenses, thereby causing the degree of light scattering to vary between individual light-emitting devices. This creates a problem in that use of more than one light-emitting device for backlighting purposes causes variations in the light distribution characteristic between the light-emitting devices, thereby failing to provide uniform light as a whole.

Thus, it is an object of the present invention to provide a light distribution controller which can be reduced in size, and is capable of providing a stable, broad light distribution characteristic, and also a light-emitting device using such a light distribution controller.

Solution to the Problem

A light distribution controller according to the present disclosure includes a first optical member configured to cover a light source, and a second optical member configured to cover the first optical member, where the first optical member has a shape of a circular truncated cone or of a prismoid which tapers from the light source, and has a first concave portion which is formed from an upper surface of the circular truncated cone or prismoid in a downward direction along a central axis of the circular truncated cone or prismoid, the first concave portion has an opening whose area increases in an upward direction along the central axis, light emitted from the light source has a Lambertian light distribution characteristic, and has a maximum light intensity in a direction along the central axis; when outputting the light emitted from the light source toward the second optical member, the first optical member converts the light into light having a light distribution characteristic which has an annular peak of light intensity centered around the central axis, the second optical member has a second concave portion formed along the central axis, the second concave portion having an opening whose area increases in an upward direction along the central axis, and of the light having the light distribution characteristic incident from the first optical member upon the second optical member, light incident upon a surface forming the second concave portion is totally reflected at the surface.

The expression "a concave portion is formed along the central axis" means that a region around the central axis, including the central axis itself, is concaved to form a concave portion.

Advantages of the Invention

The present disclosure converts the light from the light source having a Lambertian light distribution characteristic into light having a light distribution characteristic with an annular peak by the first optical member, and refracts and reflects the light traveled through the first optical member by the second optical member, thereby reducing the light intensity in the straight upward direction from the light source without loss of the total amount of light, and thus a small-sized light distribution controller which allows a light distribution characteristic in which more light is distributed in transverse directions can be achieved. Thus, the present invention can provide a small-sized light-emitting device which has a stable, broad light distribution characteristic.

DESCRIPTION OF EMBODIMENTS

Figure 16:
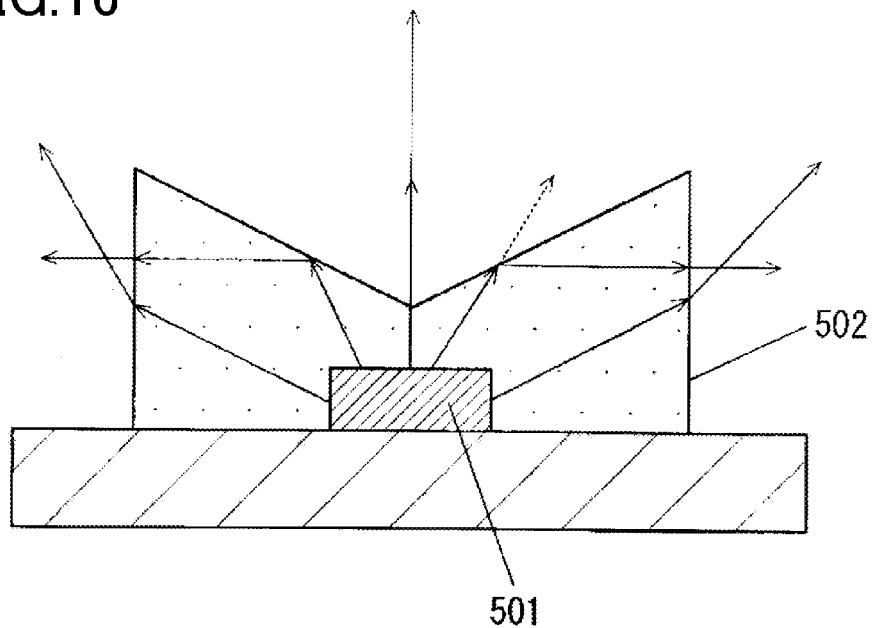
FIG. 16 is a cross-sectional view illustrating a light-emitting device according to an example for comparison.

The present inventors first studied a light-emitting device according to an example for comparison shown in FIG. 16. The light-emitting device includes an optical member 502 having a V-shaped center, which is provided over an LED 501, and light from the LED 501 is reflected at a V-shaped inner wall surface of the optical member 502, thereby allowing the light to be output in transverse directions. Defining that the angle in the straight upward direction is 0°, the light distribution characteristic of such a configuration is a relatively broad light distribution characteristic of approximately ±70° (a range of approximately 140°). However, since a broad light distribution characteristic of greater than or equal to 170° will be required in the future, this angle is insufficient. Moreover, the light intensity at the center portion is high, and also the intensity of the light projected onto the planar light control member at a constant distance from the LED 501 is not sufficiently uniform.

Figure 17:
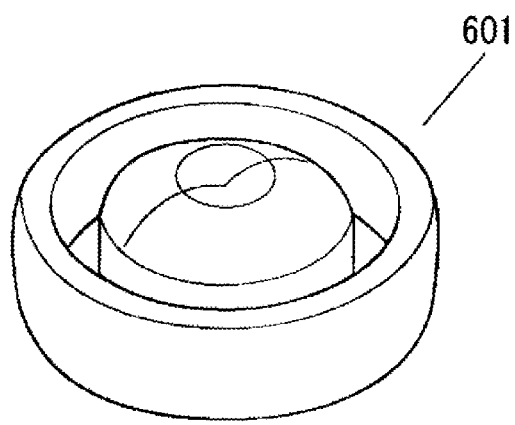
FIG. 17 illustrates a lens, which is a light distribution controller according to another example for comparison. Part (A) is a perspective view thereof, and part (B) is a cross-sectional view corresponding to part (A).
Figure 17:
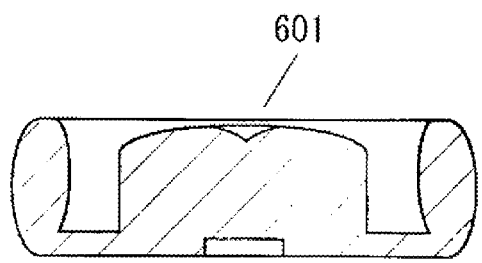

Thus, a lens having a particular shape was studied as a light distribution controller according to another example for comparison as shown in FIG. 17. The light distribution characteristic provided by the lens 601 was found to be capable of achieving a range greater than or equal to 170°. Although a broad light distribution characteristic can be achieved, the lens 601 has a complex shape and is large in size, and thus it is difficult to achieve a reduction in the thickness as required for a backlight source.

Figure 18:
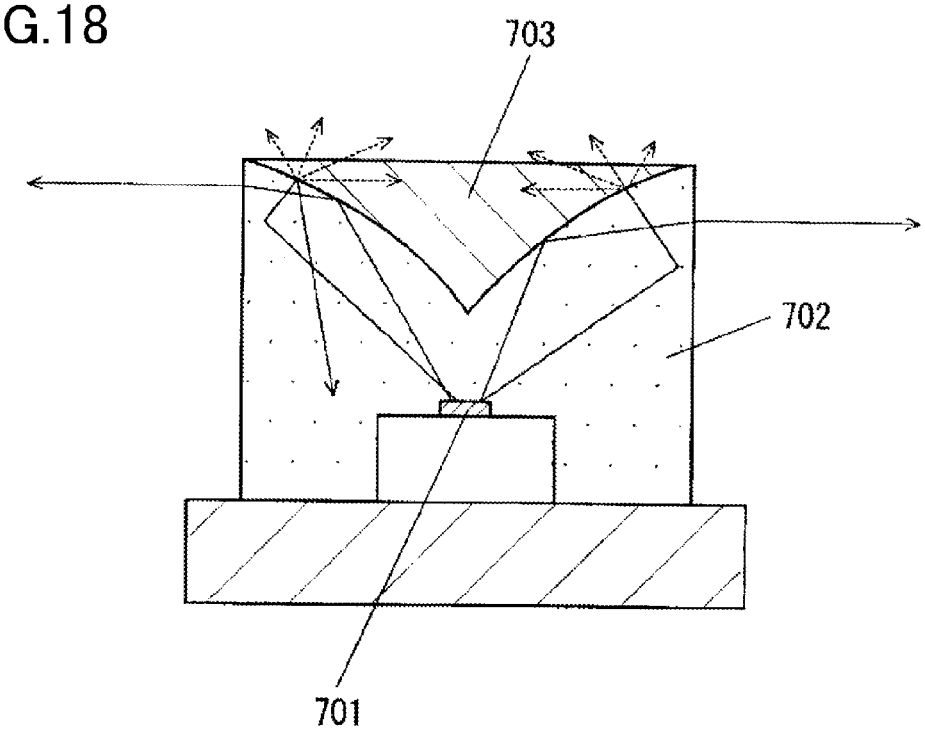
FIG. 18 is a cross-sectional view illustrating a light-emitting device according to a still another example for comparison.

In addition, as a measure to achieve a broad light distribution characteristic by using a light-scattering material in addition to a lens, a light-emitting device shown in FIG. 18 was studied as a still another example for comparison. This light-emitting device is configured such that an optical member 702 having a similar shape to that of the light-emitting device of the example for comparison shown in FIG. 16 is provided over an LED 701, and a light-scattering layer 703 containing a light-scattering material is formed over the concave portion at the center of the optical member 702, thereby scattering the light escaping from the LED 701 to above the optical member, and thus increasing the light output component in transverse directions. However, since the light-scattering material itself absorbs the light, the light-output efficiency is reduced. Moreover, variations occur during application of the light-scattering material onto the concave portions of the optical members 702, thereby causing the degree of light scattering to vary between individual light-emitting devices. Accordingly, if more than one light-emitting device is mounted on a single substrate for backlighting purposes, then variations occur in the light distribution characteristic between the light-emitting devices, thereby leading to non-uniform light distribution as a whole.

With the studies described above, and after other various studies have been made, the present inventors have developed the present invention. Example embodiments of the present disclosure will be described below.

In a first preferred configuration, a light distribution controller includes a first optical member configured to cover a light source, and a second optical member configured to cover the first optical member, where the first optical member has a shape of a circular truncated cone or of a prismoid which tapers from the light source, and has a first concave portion which is formed from an upper surface of the circular truncated cone or prismoid in a downward direction along a central axis of the circular truncated cone or prismoid, the first concave portion has an opening whose area increases in an upward direction along the central axis, light emitted from the light source has a Lambertian light distribution characteristic, and has a maximum light intensity in a direction along the central axis; when outputting the light emitted from the light source toward the second optical member, the first optical member converts the light into light having a light distribution characteristic which has an annular peak of light intensity centered around the central axis, the second optical member has a second concave portion formed along the central axis, the second concave portion having an opening whose area increases in an upward direction along the central axis, and of the light having the light distribution characteristic incident from the first optical member upon the second optical member, light incident upon a surface forming the second concave portion is totally reflected at the surface.

According to the first configuration, the light incident from the first optical member upon the second optical member has a light distribution characteristic with an annular peak centered around the central axis of the first optical member, and is totally reflected by the second concave portion of the second optical member. Thus, the totally reflected light spreads away from the central axis, thereby allowing the light from the light source, which has higher intensity along the straight upward direction, to be distributed in lateral directions. Accordingly, the light intensity in the straight upward direction can be reduced, and at the same time the light intensity in the lateral directions can be increased.

The light distribution controller may have a second configuration in which the first optical member is formed of a material having a higher refractive index than that of the second optical member.

According to the second configuration, since the first optical member is formed of a material having a higher refractive index than that of the second optical member, light can be largely refracted at the boundary between the first and second optical members.

The light distribution controller may have a third configuration in which the first optical member is formed of zinc oxide crystals.

According to the third configuration, forming the first optical member from zinc oxide crystals can provide the first optical member having a higher refractive index than those of epoxy resin and of silicone resin.

The light distribution controller may have a fourth configuration in which the first concave portion of the first optical member includes a surface formed of crystal planes including {10-11} crystal planes.

According to the fourth configuration, the inclined surface forming the inner wall surface of the first concave portion of the first optical member is formed of crystal planes including {10-11} crystal planes, and thus such an inclined surface can be easily formed by etching.

The light distribution controller may have a fifth configuration in which the first optical member is formed of a polymer containing nanoparticles.

According to the fifth configuration, forming the first optical member from a polymer containing nanoparticles can provide the first optical member having a higher refractive index than those of epoxy resin and of silicone resin which do not contain nanoparticles.

A light-emitting device according to a sixth configuration includes a semiconductor light-emitting element as a light source, and the light distribution controller disposed over the semiconductor light-emitting element.

According to the sixth configuration, even if the light source is a semiconductor light-emitting element providing high brightness in the straight upward direction, broad and uniform light distribution can be achieved by reducing the light intensity in the straight upward direction, and allowing more light to be distributed in lateral directions.

The light-emitting device may have a seventh configuration in which a fluorescent layer containing a fluorescent material which emits light having a longer wavelength than a wavelength of light emitted from the semiconductor light-emitting element, the light having the longer wavelength emitted based on the light emitted from the semiconductor light-emitting element, is disposed between the semiconductor light-emitting element and the first optical member.

According to the seventh configuration, providing a fluorescent layer allows the light from the semiconductor light-emitting element and the light emitted from the fluorescent material of the fluorescent layer to be mixed together to generate the emission color of the light-emitting device.

A method for fabricating a light distribution controller according to an eighth configuration is a method for fabricating a light distribution controller having a first optical member which covers a light source, and a second optical member which covers the first optical member, including steps of forming a plurality of masks, each of which occupies a region interposed between two concentric and axisymmetric regular hexagons, one of which is larger than the other, over an upper surface of a monocrystalline wafer of zinc oxide so that opposing sides of the masks immediately adjacent to each other are parallel to each other, forming indentations having openings of regions between the masks immediately adjacent to each other and of the smaller regular hexagons inside the masks by removing portions not covered with the masks by anisotropically etching the upper surface of the monocrystalline wafer, forming the first optical members which each are a regular hexagon as seen in a plan view by separating every two of the masks immediately adjacent to each other on the monocrystalline wafer, and forming the second optical members by covering an upper surface side of each of the first optical members with encapsulation resin, where the step of forming the second optical members forms a second concave portion having an opening whose area increases in an upward direction, above each of first concave portions, which are the indentations having the openings of the smaller regular hexagons inside the masks.

According to the eighth configuration, the light incident from the light source is directed so that the light distribution characteristic has an annular peak by means of the first optical member formed by etching the wafer of zinc oxide, and then is totally reflected by the second optical member to direct the light in the lateral directions. Thus, a light distribution controller capable of reducing the light intensity in the straight upward direction, and at the same time increasing the light intensity in the lateral directions can be fabricated.

The method for fabricating a light distribution controller may use a ninth configuration in which a central axis extending upward passing through a center of the regular hexagon in each of the first concave portions passes through a center of a bottom of the corresponding one of the second concave portions.

First Embodiment

The first embodiment will be described below. The essence of the first embodiment is to provide a small-sized light distribution controller capable of efficiently converting light from a planar light-emitting source, such as a semiconductor light-emitting element (light-emitting diode (LED)), having a Lambertian light distribution characteristic into light having a broad light distribution characteristic.

Figure 1:
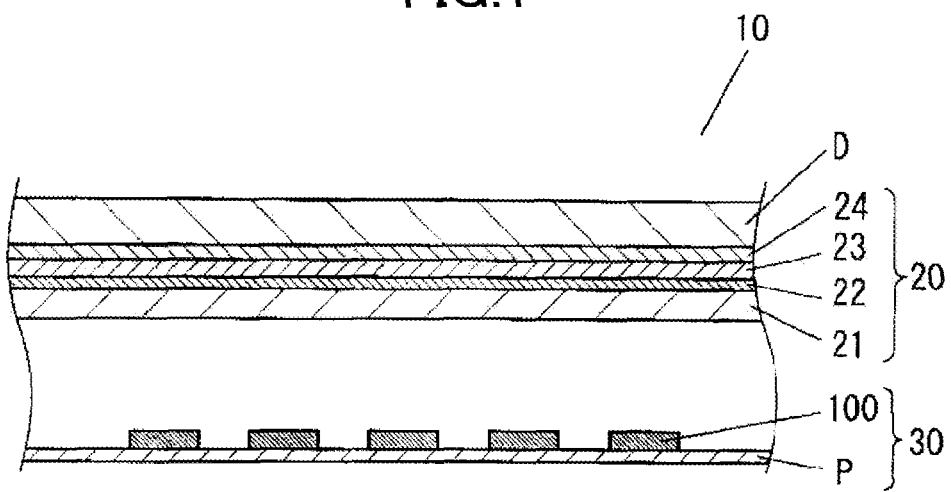
FIG. 1 is a cross-sectional view illustrating a backlight unit according to the first embodiment.

The backlight unit 10 shown in FIG. 1 is used in a wide-screen liquid crystal display (LCD) television having a display screen with a horizontal to vertical ratio of 16:9. The backlight unit 10 emits light from the back side of an LCD panel D. The backlight unit 10 includes a light control member 20 attached on the back side of the LCD panel D, and a planar light source portion 30 disposed at a predetermined distance from the light control member 20. The light control member 20 includes a diffuser panel 21, a diffuser sheet 22, a first prism sheet 23, and a second prism sheet 24.

The diffuser sheet 22 is made of polyester (PS) resin or polycarbonate (PC) resin, and is formed to have a rough surface, such as that of ground glass. The first prism sheet 23 and the second prism sheet 24 each have a prism surface on which a plurality of triangular ridges (ridges extending straight, each having a triangular cross section) made of acrylic resin are formed over a surface made of polyester resin. The prism surface is formed to have a sawtooth shape as seen in a cross-sectional view. The first and second prism sheets 23 and 24 are arranged to overlap each other so that the respective ridge directions (directions in which the ridges extend) are generally perpendicular to each other.

Figure 2:
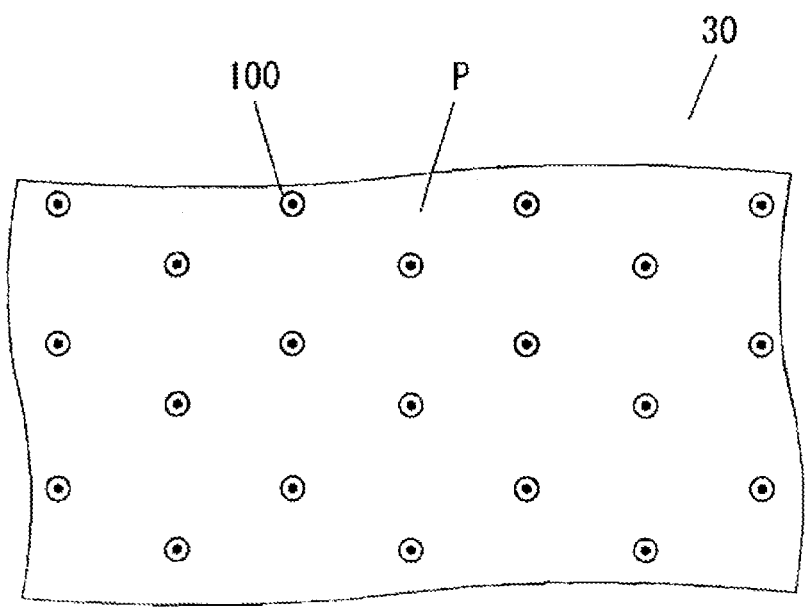
FIG. 2 is a plan view of the backlight unit shown in FIG. 1.

As shown in FIG. 2, the planar light source portion 30 includes a mount substrate P, which is a printed-wiring board, and light-emitting devices 100 arranged along a longitudinal and a lateral directions on the mount substrate P. The mount substrate P includes a large-sized insulating substrate of epoxy-based resin, etc., and an interconnect pattern (not shown in FIG. 2) for supplying power to the light-emitting devices 100 formed on the insulating substrate.

Figure 3:
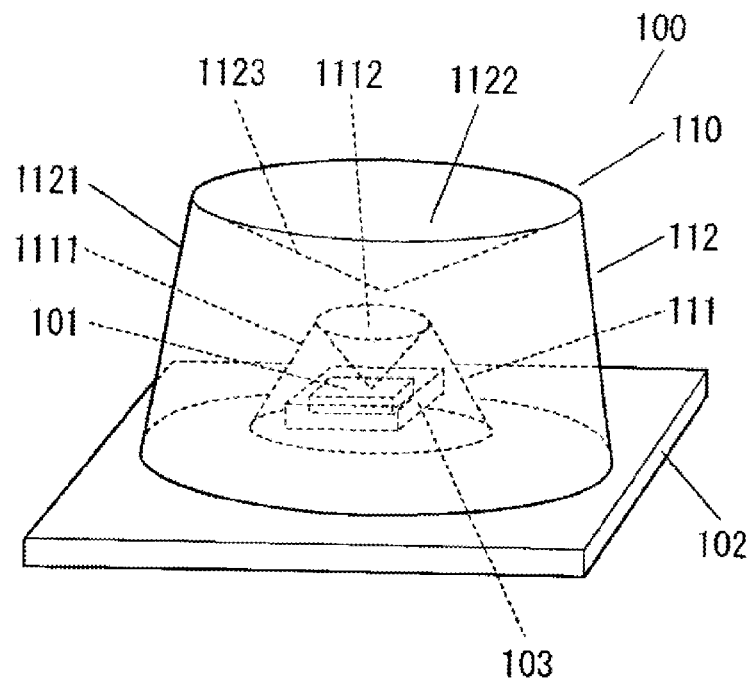
FIG. 3 is a perspective view illustrating a light-emitting device having a light distribution controller according to the first embodiment.
Figure 4:
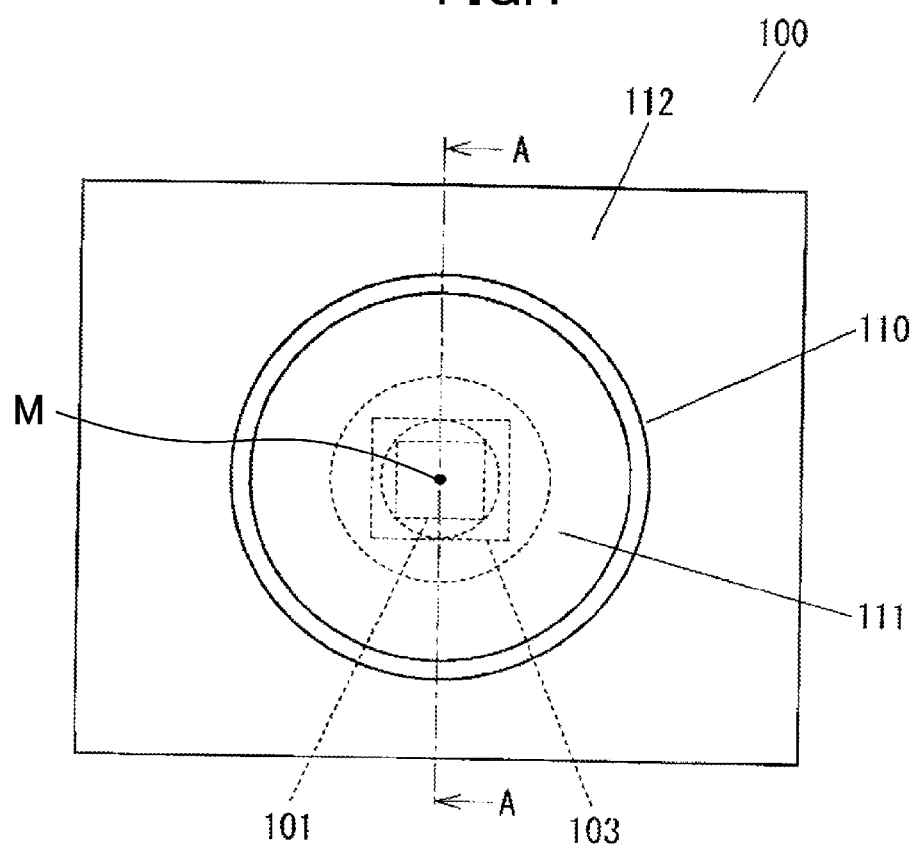
FIG. 4 is a plan view illustrating the light-emitting device shown in FIG. 3.
Figure 5:
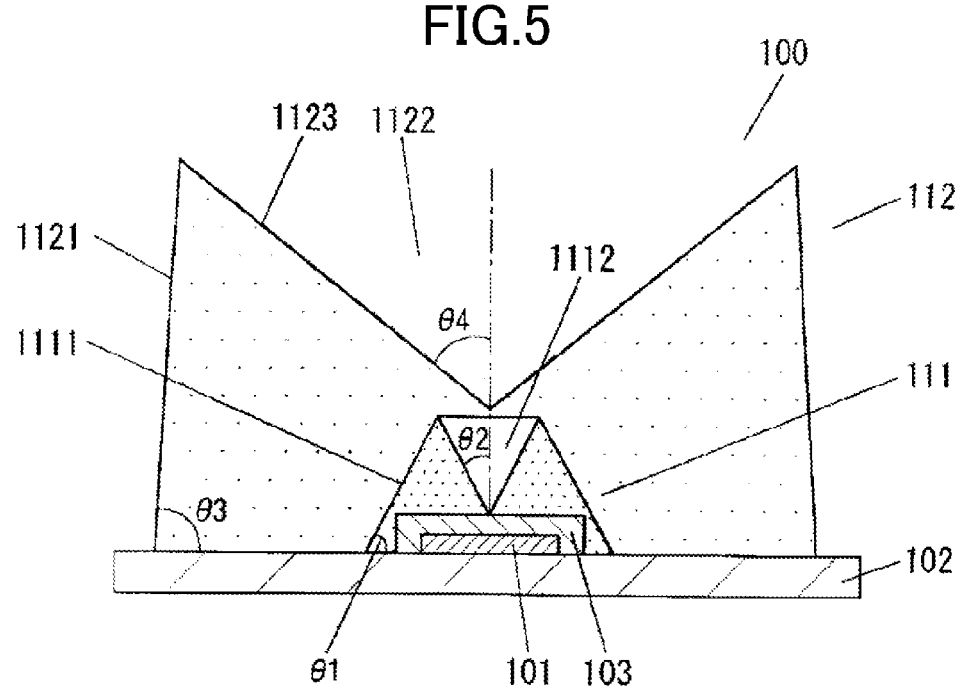
FIG. 5 is a cross-sectional view of the light-emitting device shown in FIG. 4, taken along line A-A.

Next, the light-emitting device 100 according to this embodiment will be described in detail based on FIG. 3 to FIG. 5. FIG. 3 is a perspective view of the light-emitting device 100; FIG. 4 is a plan view the light-emitting device 100, and FIG. 5 is a cross-sectional view of the light-emitting device 100 shown in FIG. 4, taken along line A-A.

The light-emitting devices 100 each include a semiconductor light-emitting element (LED) 101, which is a light source. The LED 101 is mounted on the upper surface of the package substrate 102, and a fluorescent layer 103 is provided over the emitting surface of the LED 101. The LED 101 and the fluorescent layer 103 may collectively be referred to as a light source.

The light-emitting device 100 includes a light distribution controller 110 which adjusts the light distribution of light emitted from the LED 101.

The LED 101 is a blue-light-emitting diode which functions as a point light source by conducting current between an n-side electrode, formed on an n-type semiconductor layer which is exposed by etching a light-emitting layer, a p-type semiconductor layer, and a part of the n-type semiconductor layer, and a p-side electrode coupled to the p-type semiconductor layer when the n-type semiconductor layer, the light-emitting layer, and the p-type semiconductor layer are sequentially formed on a substrate. The LED 101 has a rectangular shape with a side length of 0.1 mm to 1 mm, or has a larger shape.

The package substrate 102 includes a substrate on which an electrode pattern is formed, or a resin-molded metal lead frame.

The fluorescent layer 103 is formed in a manner such that after the LED 101 is mounted and wired on the package substrate 102, silicone resin containing a YAG fluorescent material which emits yellow light from blue light is applied using a screen printing technique, covering the entire LED 101.

The light distribution controller 110 includes a first optical member 111 and a second optical member 112. The first optical member 111 is formed so as to cover the entire fluorescent layer 103. The outer wall surface 1111 is a light output surface of the first optical member 111, through which light is output outward. The outer wall surface 1111 is the side surface of a circular truncated cone, and forms a circular cone surface which tapers from the package substrate 102 side in the upward direction. In this embodiment, an inclination angle θ1, that is, the angle between the outer wall surface 1111 and the upper surface of the package substrate 102, is predetermined to be 60° (see FIG. 5). A first concave portion 1112, which has a circular cone shape with its apex positioned down below, is provided from the upper surface portion of the circular truncated cone shape of the first optical member 111. The central axis of the circular truncated cone formed by the outer wall surface 1111 and the central axis of the circular cone formed by the first concave portion coincide. The area of the opening of the first concave portion 1112 increases in the upward direction along the central axis of the circular truncated cone. In the first concave portion 1112, the angle θ2 between the inner inclined surface and the central axis is predetermined to be approximately 30° (opening angle of 60°) (see FIG. 5). Light is also output from the surface forming the first concave portion 1112.

The central axes are generally perpendicular to the upper surface of the package substrate 102, and also coincide with the central axis of the circular cone shape of the second concave portion 1122 of the second optical member 112 described later.

The first optical member 111 uses silicone resin (refractive index: 1.42) as its material, which contains nanoparticles of a high refractive index material $BaTiO_3$ (refractive index: 2.4). Thus, the first optical member 111 has a refractive index of 1.7-1.8 as a whole.

The second optical member 112 is formed so as to cover the entire first optical member 111. Similarly to the outer wall surface 1111 of the first optical member 111, the outer wall surface 1121 of the second optical member 112 is the side surface of a circular truncated cone, and forms a circular cone surface which tapers from the package substrate 102 side in the upward direction. In this embodiment, an inclination angle θ3, that is, the angle between the outer wall surface 1121, serving as the outer light output surface, and the upper surface of the package substrate 102 is predetermined to be 85° (see FIG. 5). A second concave portion 1122, which has a circular cone shape with its apex positioned down below, is provided from the upper surface portion of the circular truncated cone shape of the second optical member 112. In the second concave portion 1122, the angle θ4 between the inner wall surface 1123 and the central axis is predetermined to be approximately 60° (opening angle of 120°) (see FIG. 5). In this embodiment, the second optical member 112 uses silicone resin (refractive index: 1.42) as its material. In the second optical member 112, the angle θ4 between the inner inclined surface of the second concave portion 1122 and the central axis is predetermined to be approximately 60°. Thus, the critical angle at which the light incident from the first optical member 111 upon the second optical member 112 is totally reflected (angle between the incoming direction of the light and a line perpendicular to the inner wall surface 1123) is 52.1°.

The light-emitting device 100 can be produced as follows.

First, after mounting and wiring the LED 101 on the package substrate 102, the fluorescent layer 103 is formed. Then, the first optical member 111, made of resin, having the first concave portion 1112 having a circular cone shape with its apex directed toward the LED 101 is molded by resin molding using a mold. Covering the fluorescent layer 103 with the first optical member 111 causes the boundary between the first optical member 111 and the fluorescent layer 103 to become a light input surface. Examples of the molding technique include compression molding, transfer molding, etc.

Next, after the first optical member 111 is molded, the package substrate 102 is placed on another mold to mold the second optical member 112 formed of either silicone resin or epoxy resin.

Thus, the light distribution controller 110 including the first optical member 111 and the second optical member 112 is formed. During this forming operation, the production operation is performed so that the centers of the first and second optical members 111 and 112 align with the center M of the LED 101.

With the configuration described above, a part of light from the LED 101, which emits blue light, is excited in the fluorescent layer 103 so that the frequency is converted, and thus yellow light can be emitted. The blue light, and the yellow light from the fluorescent material are mixed in the fluorescent layer 103, and are further mixed in the first optical member 111, then the mixed light is broadly distributed by the second optical member 112. Thus, a light-emitting device which provides broadly distributed white color, highly uniform in color, as an emission color can be achieved.

Here, since any fluorescent material which emits light of yellow color, that is, the complementary color of blue, enables the fluorescent layer 103 to mix the blue color and the yellow color together to output white light, a silicate fluorescent material may also be used instead of a YAG fluorescent material. In addition, in order to improve color rendering properties of the white light, a combination of red and green fluorescent materials or a combination of red and yellow fluorescent materials may also be used.

Figure 19:
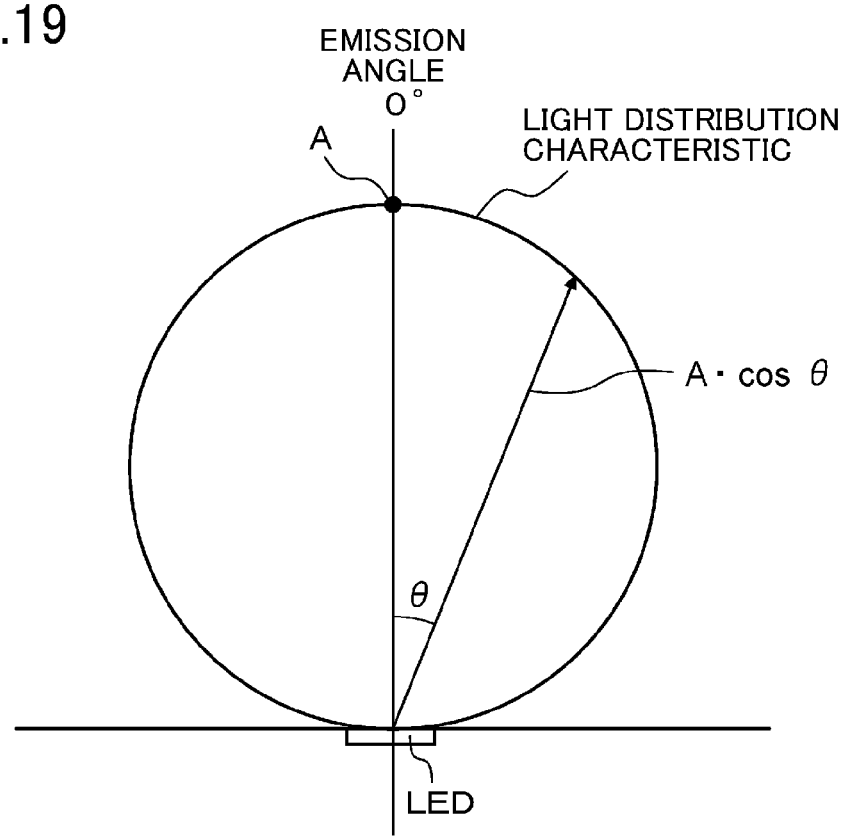
FIG. 19 is a graph showing a light distribution characteristic of the LED.

Note that the fluorescent layer 103 does not necessarily need to be formed. In such a case, the light-emitting device 100 emits blue light. FIG. 19 is a diagram showing a light distribution characteristic of the LED 101. This light distribution characteristic is referred to as a Lambertian light distribution characteristic. In FIG. 19, the intensity of the light emitted from the LED 101 is indicated by the length of the arrow: the intensity of the light increases as the light output direction lies closer to the straight upward direction of the LED 101, and decreases as the light output direction lies away from the straight upward direction. Even when the fluorescent layer 103 is formed over the LED 101, the light emitted from the fluorescent layer 103 also has the light distribution characteristic shown in FIG. 19.

Figure 6:
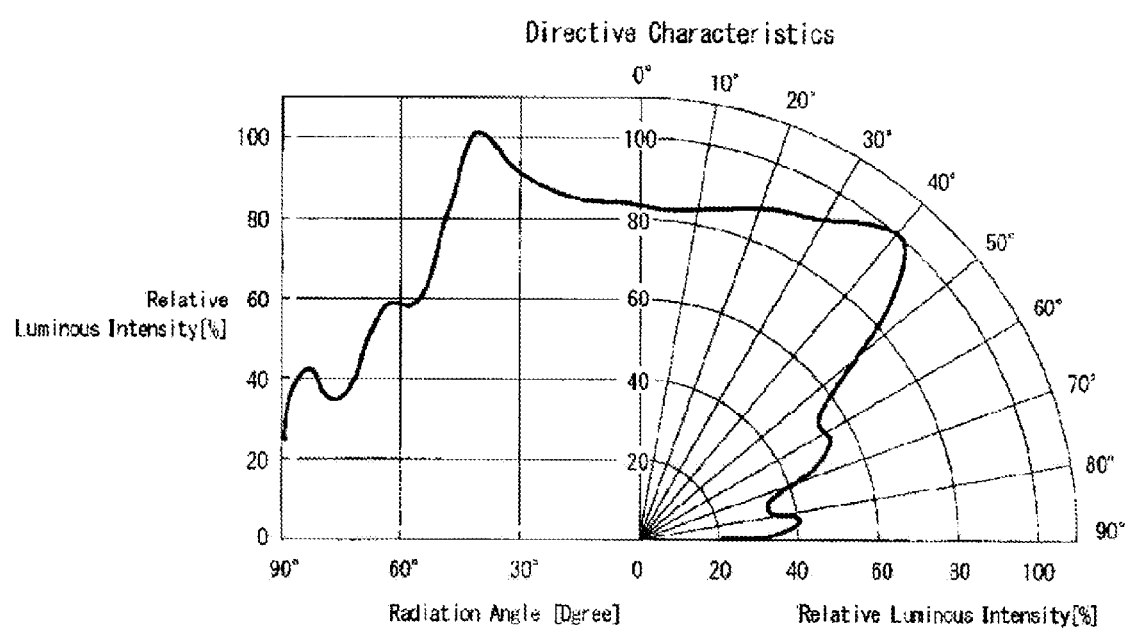
FIG. 6 is a graph showing a result of calculating a light distribution characteristic of light traveled through the first optical member having the configuration of the first embodiment.
Figure 7:
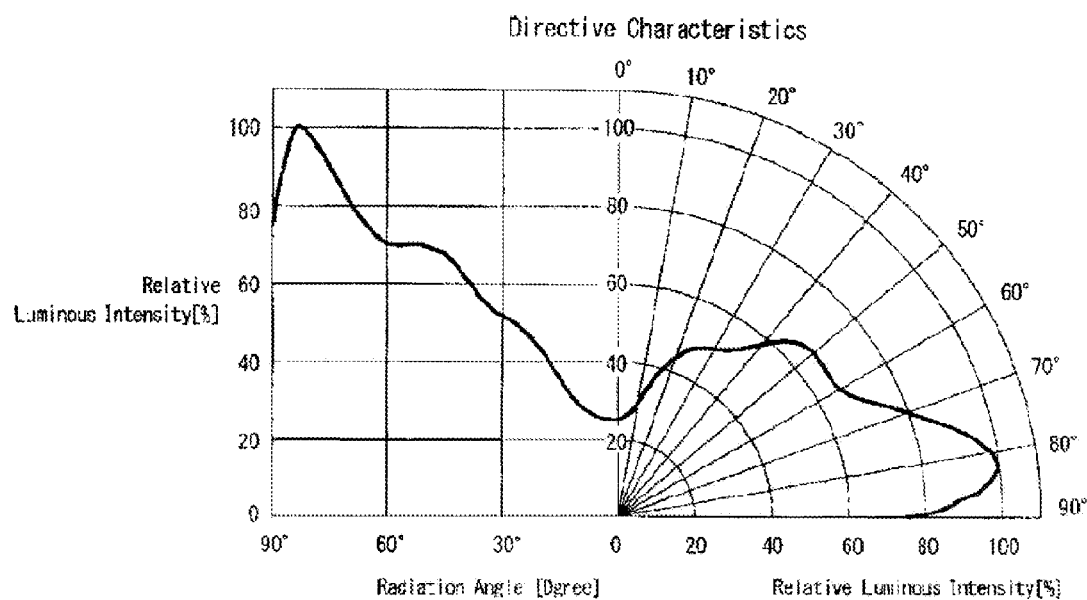
FIG. 7 is a graph showing a result of calculating a light distribution characteristic of light traveled through the second optical member having the configuration of the first embodiment.

Here, a simulation result for the light distribution characteristic is described based on FIGS. 6 and 7. FIG. 6 illustrates a result of calculating a light distribution characteristic assuming that the entire neighborhood (atmosphere) of the first optical member 111 has a same refractive index as that of the silicone resin forming the second optical member 112. As shown in FIG. 6, the light distribution characteristic peaks at an angle of approximately 40°, and an annular peak is observed around the central axis. It can be seen that this light distribution characteristic provides light distribution in which the intensity gradually decreases from the angle of the peak toward the central axis (direction at 0°), and rapidly decreases from the angle of the peak toward the horizontal direction (direction at 90°). This is because light traveling in the straight upward direction is refracted away from the central axis when output from the first concave portion 1112, and moreover, light traveling in an obliquely upward direction is refracted toward the central axis when output from the outer wall surface 1111. Since the refractive index of the first optical member 111 is as high as 1.7-1.8 while the refractive index of the second optical member 112 is 1.42, light can be largely refracted at the boundary between the first optical member 111 and the second optical member 112.

In this embodiment, since the first optical member 111 includes the first concave portion 1112 having an opening whose area increases in the upward direction along the central axis away from the LED 101, a light distribution characteristic having an annular peak centered around the central axis is provided when light is incident from the first optical member 111 upon the second optical member 112.

Accordingly, the light incident from the first optical member 111 upon the second optical member 112 is refracted when input to the second optical member 112, and travels in the second optical member 112 with the light intensity peak at an angle of approximately 40° with respect to the central axis. That is, the angle of incidence of peak light incident upon the inner wall surface 1123 of the second concave portion 1122 is approximately 20° (i.e., the angle with respect to a line perpendicular to the inner wall surface 1123 is approximately 70°). Since the critical angle (52.1° is exceeded, light at near-peak intensity traveled through the first optical member 111 is totally reflected at the inner wall surface 1123 of the second optical member 112.

In this embodiment, the angle between the inner wall surface 1123 of the second optical member 112 and the central axis is predetermined so that the angle of incidence of light having intensity near the annular peak output from the first optical member 111 with respect to the inner wall surface 1123 equals or exceeds the critical angle at the inner wall surface 1123. For example, in the configuration in this embodiment, the above-mentioned angle is predetermined so as to satisfy the relationship $\theta B \leq 90-(\theta 4-\theta A)$, where the angle with respect to the central axis of the annular peak is designated by $\theta A$, and the critical angle at the inner wall surface 1123 is designated by $\theta B$.

Note that the entire surface of the inner wall surface 1123 does not necessarily need to have such an angle, but it suffices to configure such that at least a region reached by light near the annular peak of light intensity caused by the first optical member 111 is at an angle that equals or exceeds the critical angle.

Next, the light distribution characteristic of the light output from the second optical member 112 will be described based on FIG. 7.

FIG. 7 illustrates a result of calculating a light distribution characteristic of light output from the outer surface of the second optical member 112 in this embodiment. FIG. 7 shows that a broad light distribution characteristic in which intensity at the center is reduced is provided. This results from the fact that the light having an annular distribution caused by the first optical member 111 is totally reflected by the inner wall surface 1123 of the second concave portion 1122 of the second optical member 112, and is directed toward the outer wall surface 1121 of the second optical member 112.

In this embodiment, light having a Lambertian light distribution characteristic emitted from the LED 101 can be converted into light having a light distribution characteristic with a steep annular peak by the first optical member 111, and accordingly the second optical member 112 only needs to be configured to reflect the light concentrated by the first optical member 111 (the light having a light distribution characteristic with a steep annular peak). Therefore, the second optical member 112 can have a simple shape, and can be reduced in size.

As described above, by providing the light distribution controller 110 including the first optical member 111 and the second optical member 112 over the LED 101, light from the LED 101, having a high intensity in the straight upward direction, can be directed in lateral directions. Accordingly, the light intensity in the straight upward direction can be reduced, and at the same time the light intensity in the lateral directions can be increased. Thus, a small-sized light-emitting device which can reduce the light intensity in the straight upward direction from the chip, and at the same time achieves a broad light distribution characteristic can be provided.

Although the foregoing description has presented a resin containing nanoparticles having a high refractive index as the material of the first optical member 111 of this embodiment, the nanoparticles used may be of a material having a high refractive index and having a similar effect, such as ZnO (refractive index: 2.1), ZrO (refractive index: 2.4), $SrTiO_3$ (refractive index: 2.37), etc., or otherwise a moldable material having a similar function may be used when not containing nanoparticles having a high refractive index.

In addition, although this embodiment has been described in terms of the configuration in which light having intensity near the annular peak caused by the first optical member 111 is totally reflected at the inner wall surface 1123 of the second optical member 112, such light does not necessarily need to be totally reflected. Insofar as the angle between the inner wall surface 1123 of the second optical member 112 and the central axis is greater than the angle with respect to the central axis of the annular peak, refraction has an effect to direct the light having intensity near the annular peak further away from the central axis.

For example, it is only required that the angle between the inner wall surface 1123 of the second concave portion 1122 and the central axis is greater than the angle between the inner wall surface of the first concave portion 1112 and the central axis.

Second Embodiment

Figure 8:
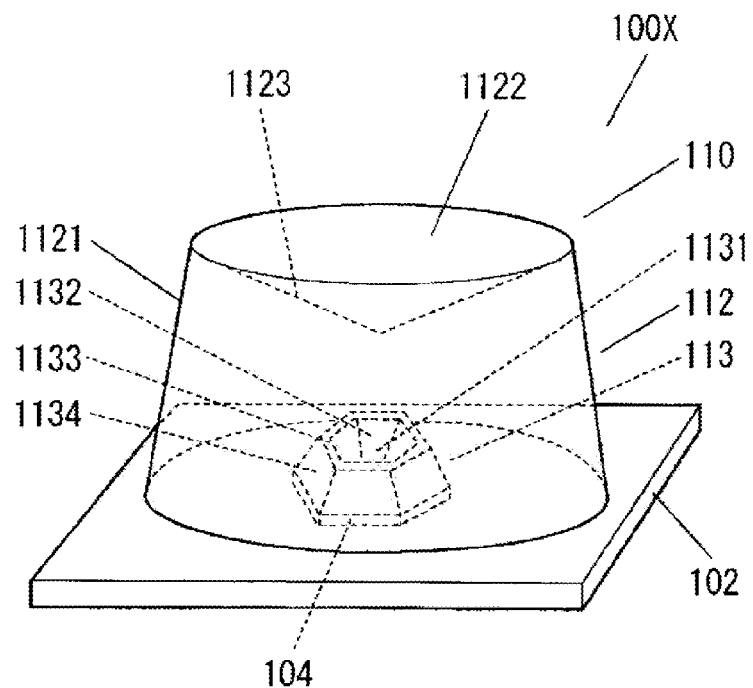
FIG. 8 is a perspective view illustrating a light-emitting device having a light distribution controller according to the second embodiment.
Figure 9:
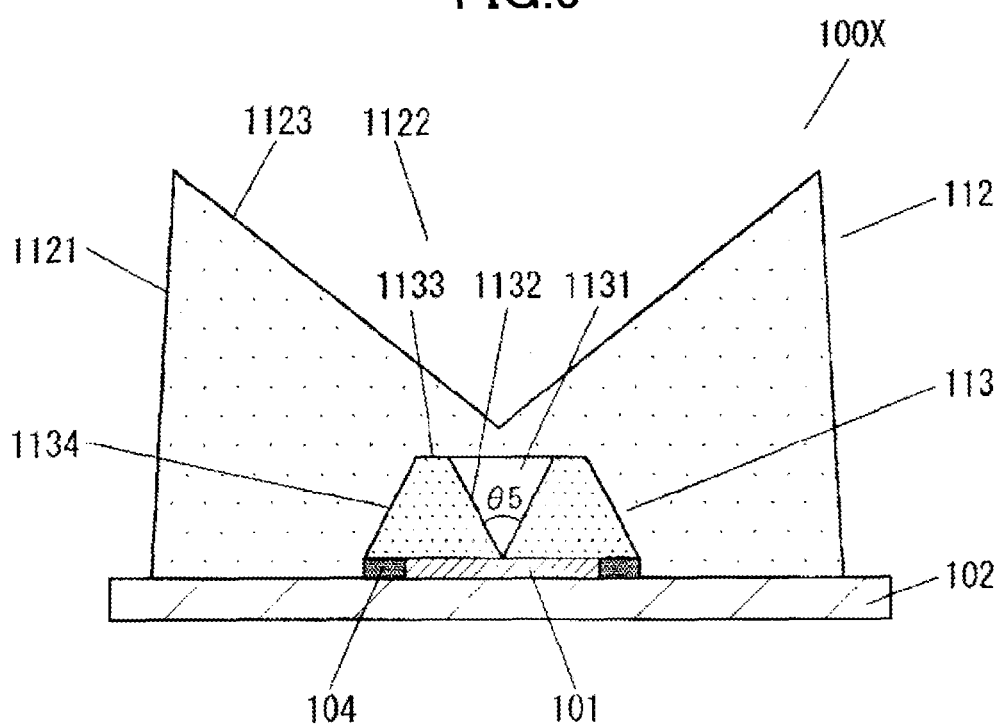
FIG. 9 is a cross-sectional view illustrating the light-emitting device shown in FIG. 8.

While the first embodiment forms the first optical members by resin molding, the second embodiment has a configuration using zinc oxide (ZnO) crystals which is stable as a material and which can uniformly form the shapes. Such a configuration will be described below. FIG. 8 illustrates a perspective view of this configuration, and FIG. 9 illustrates a cross-sectional view of the light-emitting device shown in FIG. 8. In FIGS. 8 and 9, components having similar configurations to those of FIG. 3 to FIG. 5 are designated by the same reference characters, and the explanation thereof will be omitted.

Similarly to the first embodiment, a light-emitting device 100x according to the second embodiment includes the LED 101 mounted on the package substrate 102, over which a first optical member 113 formed of ZnO is provided interposing a transparent adhesive 104. The refractive index of the transparent adhesive 104 used here is 1.4-1.55, but is not limited thereto.

It is preferable that the transparent adhesive 104 be a phenyl-based silicone resin having a relatively high refractive index, and it is preferable that the refractive indices of the LED 101, of ZnO, and of the transparent adhesive 104 decrease in that order. Such a configuration enables the light from the LED 101, having a high refractive index of approximately 2.4, to be efficiently transmitted into the transparent adhesive 104, and then into the first optical member 113 formed of ZnO. Thereafter, the second optical member 112 formed of silicone resin is formed by molding.

Here, the first optical member 113 formed of ZnO is described. The first optical member 113 is a hexagonal prismoid in shape, and is approximately 0.5 mm in height. The first optical member 113 includes a first concave portion 1131, which concaves with an opening of a regular hexagon shape, inward from the upper surface portion 1133 of the first optical member 113. The first concave portion 1131 has a hexagonal prismoid shape having six inclined surfaces, which each are an isosceles triangle whose base is formed by one side of the regular hexagon which is the opening shape, and whose oblique sides are respectively shared by the immediately adjacent isosceles triangles without space therebetween. The inclined surfaces are formed of {10-11} crystal planes which are exposed by removing ZnO using anisotropic etching. Forming the inclined surfaces by {10-11} crystal planes generates an inner wall surface 1132 having an opening angle θ5 of 60°. Note that each of the inclined surfaces of the first concave portion 1131 is not limited to this shape, but may be formed of multiple planes including {10-11} crystal planes and other planes, or may be formed of planes including no {10-11} crystal planes.

The upper surface portion 1133 of the first optical member 113 has a hexagonal strip shape as seen in a plan view. The inner profile of the hexagonal strip of the upper surface portion 1133 forms the edge of the opening of the first concave portion 1131 having a regular hexagon shape. A thin film (not shown) of a $SiO_2$ film having a predetermined thickness in a range from approximately 0.1 μm to approximately 1 μm is disposed over the upper surface portion 1133.

Note that the $SiO_2$ film disposed over the first optical member 113 serves as a stable mask, which is described later, and is superior in transparency as compared to thin film metal such as Ti, thereby allowing light to be propagated into the second optical member 112 without light absorption loss.

In addition, the first optical member 113 includes outer wall surfaces 1134 each having a profile which broadens from the outer edge of the upper surface portion 1133 in obliquely downward directions. The outer wall surfaces 1134 are each formed in a trapezoidal shape.

Similarly to the first embodiment, the second optical member 112 is formed of transparent resin, which is either silicone resin or epoxy resin, and is formed in a generally circular truncated cone shape. In the second optical member 112, the boundary between the second optical member 112 and the inner wall surface 1132, the upper surface portion 1133, which is a flat surface, and the outer wall surface 1134 of the first optical member 113 function as the incident surface.

Figure 10:
FIG. 10 is a set of cross-sectional views for explaining the fabrication process of the first optical member of the second embodiment.
Figure 10:
Figure 10:
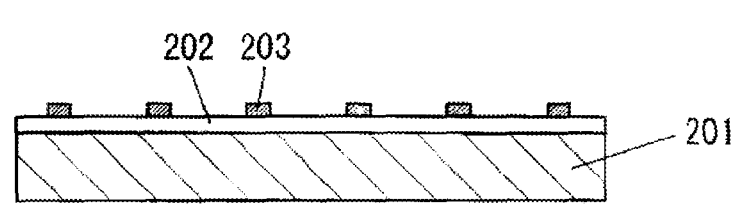
Figure 10:
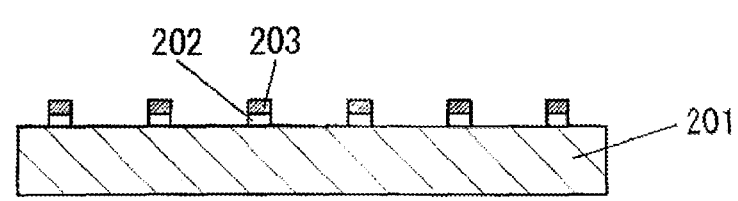
Figure 10:
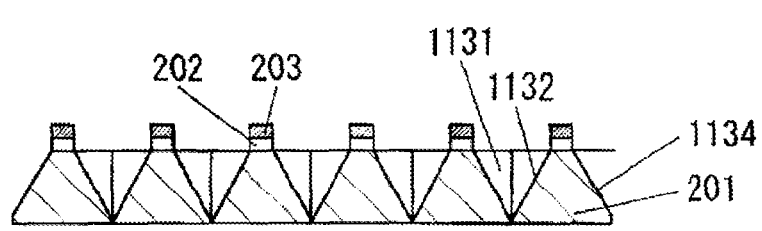
Figure 10:
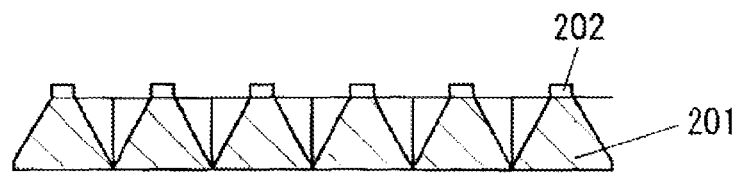
Figure 10:
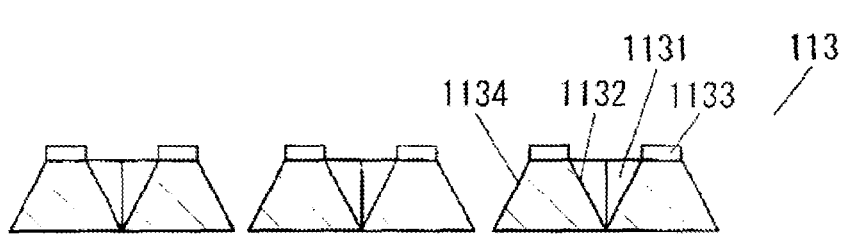
Figure 11:
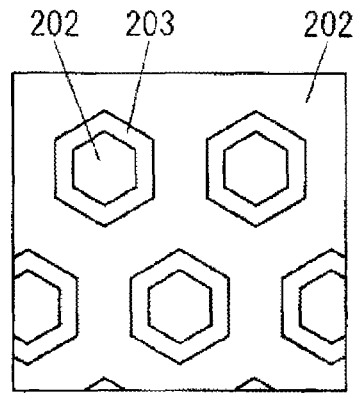
FIG. 11 is a set of plan views for explaining the fabrication process of the first optical member of the second embodiment.
Figure 11:
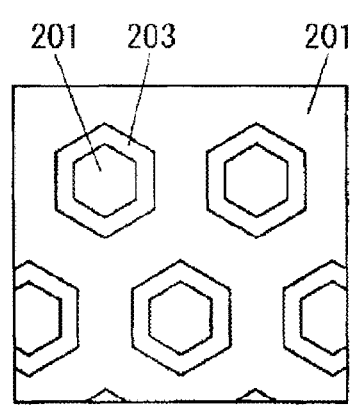
Figure 11:
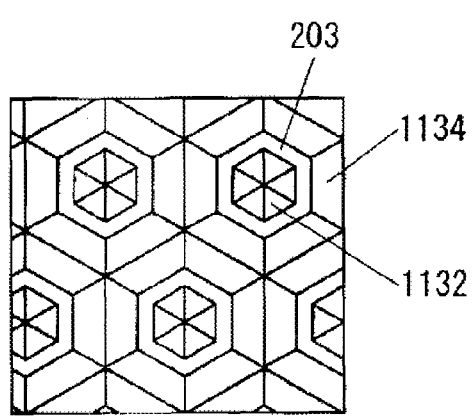
Figure 11:
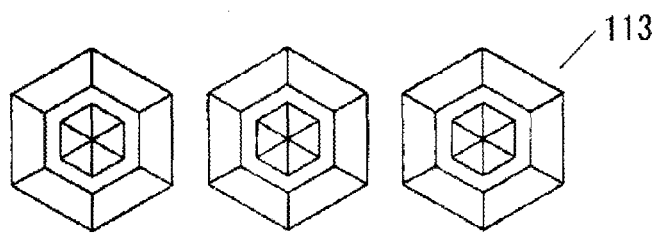

Here, a method for fabricating, and a shape of, the first optical member 113 formed of ZnO characterizing this embodiment is described based on FIGS. 10 and 11.

First, a monocrystalline wafer of ZnO (ZnO wafer) 201 having a thickness of 0.5 mm is prepared (see part (A) of FIG. 10). Next, a silicon oxide ($SiO_2$) film 202 having a thickness of 0.8 μm is deposited over the upper surface of the ZnO wafer 201 using a chemical vapor deposition (CVD) technique (see part (B) of FIG. 10).

A photoresist 203 is applied on the entire $SiO_2$ film 202, and is patterned as shown in part (C) of FIG. 10 and in part (A) of FIG. 11. This patterning generates multiple patterns each including the photoresist 203 of a hexagonal strip shape interposed between two concentric hexagons, one of which is larger than the other, with each pair of corresponding sides parallel to each other, on the $SiO_2$ film 202. In immediately adjacent patterns, opposing sides are parallel to each other.

Next, the portions of the $SiO_2$ film 202 which are not covered with the photoresist 203 is removed by chemical etching. Thus, the portions of the $SiO_2$ film 202 where the mask patterns of the photoresist 203 are provided are left, but the ZnO wafer 201 in the other portions is exposed (see part (D) of FIG. 10 and part (B) of FIG. 11). The remaining $SiO_2$ film 202 forms multiple masks of hexagonal strips having a similar shape to the photoresist 203.

Next, the ZnO wafer 201 is etched anisotropically by chemical etching to form the concave portion 1131 (inner wall surface 1132) and the outer wall surface 1134 (see part (E) of FIG. 10 and part (C) of FIG. 11).

Next, the photoresist 203 over the $SiO_2$ film 202 is removed by an organic solvent such as acetone to form the upper surface portion 1133, which is a flat surface (see part (F) of FIG. 10).

Finally, separation of immediately adjacent masks achieves the structure of each mask, thereby generating the first optical member 113 (see part (G) of FIG. 10 and part (D) of FIG. 11). The separation can be performed by cleaving the deepest portions of the hollows between immediately adjacent masks by, for example, scribing (a technique for cleaving). A dicer may also be used for separation.

Figure 12:
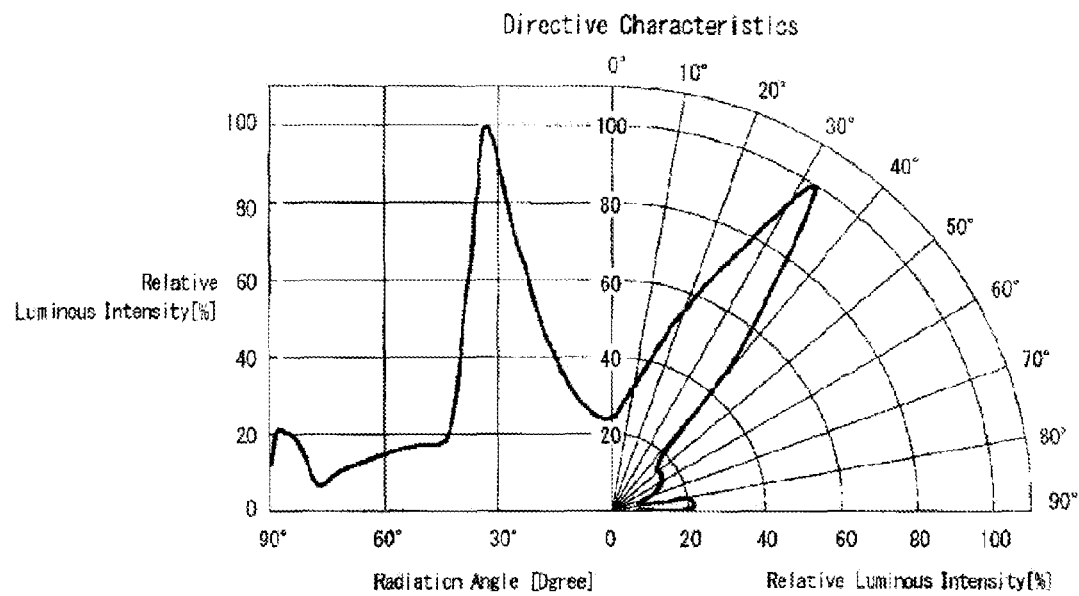
FIG. 12 is a graph showing a result of calculating a light distribution characteristic of light traveled through the first optical member having the configuration of the second embodiment.

Here, a light distribution characteristic of light incident from the first optical member 113 upon the second optical member 112 is shown in FIG. 12. The graph shown in FIG. 12 shows that the light is distributed such that the brightness is the highest in a direction of approximately 30° from the straight upward direction (0°). That is, it is shown that, above the first optical member 113, light in the form of a ring centered around the straight upward direction of the LED 101, having the radius directed in the direction of approximately 30°, travels in the second optical member 112 while broadening.

Then, the light in the form of a ring which has traveled through the second optical member 112 reaches the inner wall surface 1123 of the second concave portion 1122, having a wider opening angle than that of the first concave portion 1131 of the first optical member 113.

The intensity peak of the light output from the first optical member 113 and refracted at the boundary between the first optical member 113 and the second optical member 112 lies at an angle of approximately 30° with respect to the central axis. Accordingly, the angle of incidence upon the inner wall surface 1123 of the second concave portion 1122 is approximately 60° (i.e., the angle with respect to a line perpendicular to the inner wall surface 1123 is approximately 60°). Since the critical angle (52.1° is exceeded, light at near-peak intensity traveled through the first optical member 113 is totally reflected at the inner wall surface 1123.

Thus, the light from the first optical member 113 is reflected at the inner wall surface 1123, thereby being output in the lateral directions while increasing the radius of the ring.

Since the second concave portion 1122 of the second optical member 112 is formed in a circular cone shape, light closer in the straight upward direction can be reduced, thereby allowing more light to be distributed in lateral directions. Since the radius of the outer wall surface 1121 gradually increases in the direction from the upper surface portion 1133 to the package substrate, the light distributed in lateral directions is further refracted in obliquely downward directions.

Figure 13:
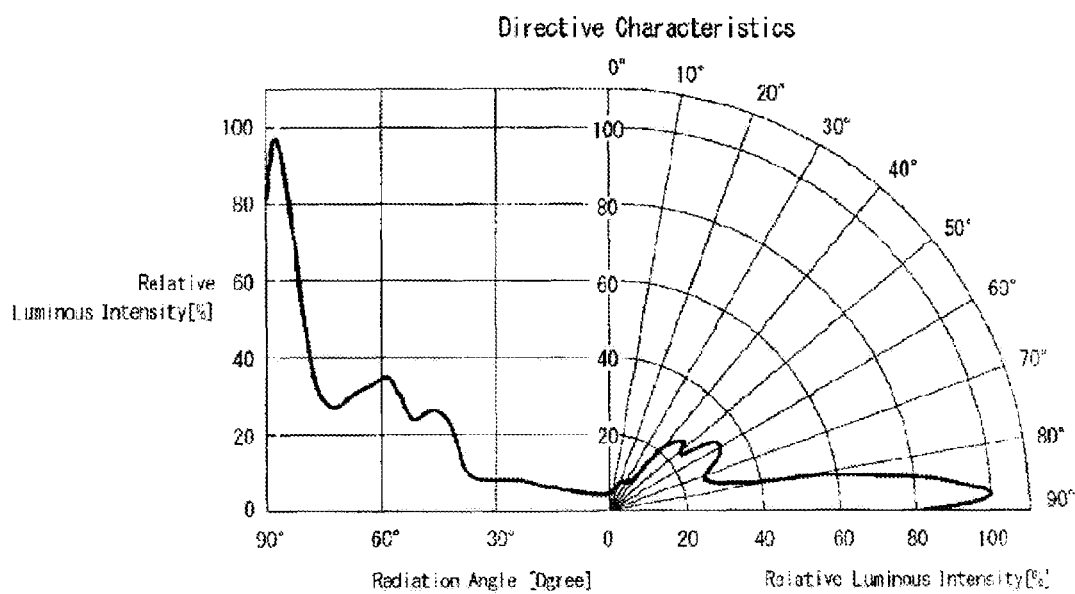
FIG. 13 is a graph showing a result of calculating a light distribution characteristic of light traveled through the second optical member having the configuration of the second embodiment.

A light distribution characteristic of such light output from the second optical member 112 is shown in FIG. 13. The graph shown in FIG. 13 shows that the light is distributed such that the brightness is the highest in a direction of approximately 90° from the straight upward direction (0°), that is, in the completely lateral direction. Moreover, it is shown that the light is hardly output in the straight upward direction.

As described above, in the light-emitting device 100x, since the first optical member 113 can have a higher refractive index than that of the second optical member 112 formed of silicone resin by forming the first optical member 113 from ZnO, light can be largely refracted at the boundary between the first optical member 113 and the second optical member 112. Thus, the distribution of the light output from the first optical member 113 can be arranged to have a steeper annular peak than the first optical member 111 according to the first embodiment, thereby achieving a greater light output angle from the second optical member 112, and thus allowing the light to be output in more lateral directions.

Third Embodiment

Figure 14:
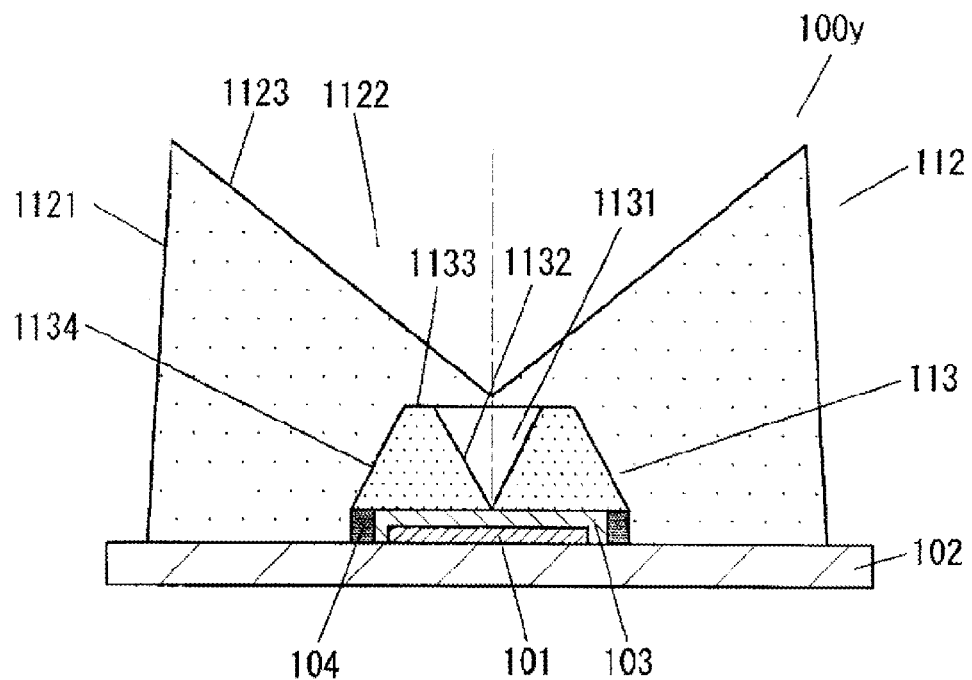
FIG. 14 is a cross-sectional view illustrating a light-emitting device having a light distribution controller according to the third embodiment.

Although the second embodiment has been presented in terms of the configuration for converting light from an LED itself into broadly distributed light, a configuration will be described below which uses a combination of a blue LED, which is widely used for lighting applications, and a fluorescent material. The configuration of this embodiment can efficiently achieve a broad light distribution characteristic also for mixed light of light from an LED and light from a fluorescent material. FIG. 14 illustrates a cross-sectional view of a light-emitting device according to this embodiment. In FIG. 14, components having similar configurations to those of FIG. 9 are designated by the same reference characters, and the explanation thereof will be omitted.

A light-emitting device 100y of this embodiment includes a light source in which the fluorescent layer 103 is disposed over the LED 101. The fluorescent layer 103 is formed in a manner such that after the LED 101 is mounted and wired on the package substrate 102, silicone resin containing a YAG fluorescent material which emits yellow light from blue light is applied using a screen printing technique, covering the entire LED 101. Further, the transparent adhesive 104 is applied using a screen printing technique, thereby fixing the first optical member 113 formed of ZnO, described in the second embodiment, on the fluorescent layer 103 by means of the transparent adhesive 104. Then, the second optical member 112 formed of either silicone resin or epoxy resin is formed by molding so as to cover the LED 101 and the first optical member 113.

With the configuration described above, a part of light from the LED 101, which emits blue light, is excited in the fluorescent layer 103 so that the frequency is converted, and thus yellow light can be emitted. The blue light, and the yellow light from the fluorescent material are mixed in the fluorescent layer 103, and are further mixed in the first optical member 113, then the mixed light is broadly distributed by the second optical member 112. Thus, a light-emitting device which provides broadly distributed white color, highly uniform in color, as an emission color can be achieved.

Here, since any fluorescent material which emits light of yellow color, that is, the complementary color of blue, enables the fluorescent layer 103 to mix the blue color and the yellow color together to output white light, a silicate fluorescent material may also be used instead of a YAG fluorescent material. In addition, in order to improve color rendering properties of the white light, a combination of red and green fluorescent materials or a combination of red and yellow fluorescent materials may also be used.

Although this embodiment employs as the first optical member the first optical member 113 according to the second embodiment, the first optical member 111 according to the first embodiment may also be employed.

Figure 15:
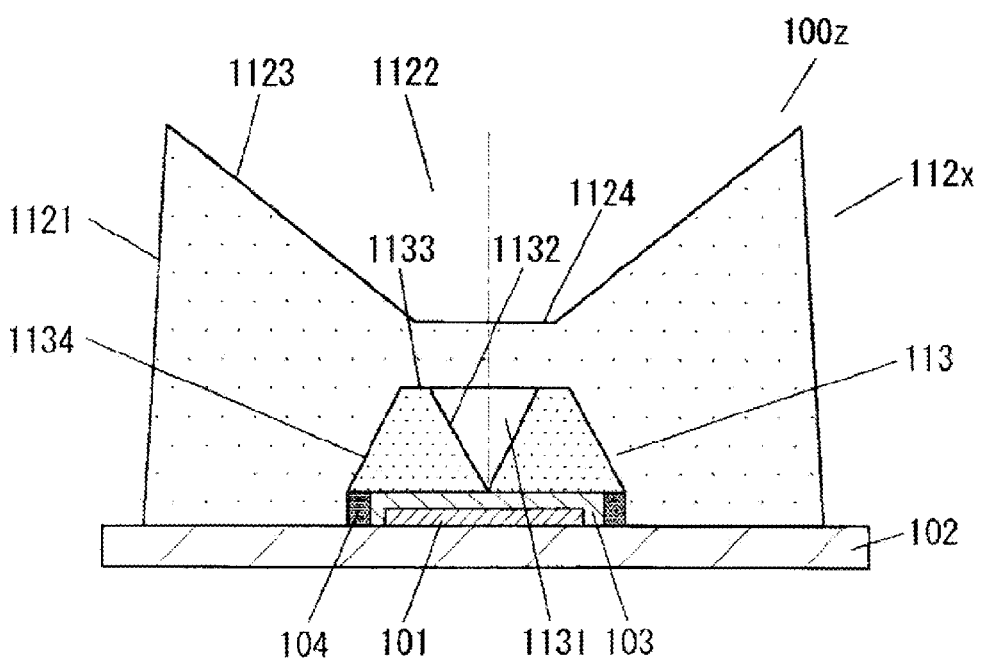
FIG. 15 is a cross-sectional view illustrating a light-emitting device having a light distribution controller which increases light in the straight upward direction according to the third embodiment.

Although the configurations described above can provide a white-light-emitting device which provides broad light distribution, if a certain intensity is required at the center for general lighting applications, forming a flat portion 1124 on the LED side (bottom portion) of the concave portion 1122 of the second optical member 112 as shown in FIG. 15 can increase the amount of light in the straight upward direction. With such a configuration, a light distribution controller and a light-emitting device which can be reduced in size, and is capable of providing a stable, broad light distribution characteristic can be provided, and also desired light intensity can be provided at the center as needed.

Other Embodiments

While the foregoing description has been provided for example embodiments of the present disclosure, the present invention is not limited to the particular embodiments described above, but also includes various modifications that can be made by those skilled in the art within the bounds of technical common sense. For example, although the first optical member 113 according to the second or third embodiment has been described in which the outer profile and the concave portion 1131 are each formed in a hexagonal shape by anisotropically etching using the crystal plane of ZnO, the shape may also be a circular cone as the first embodiment, or a quadrangular, pentagonal, octagonal, or higher-order polygonal pyramid as long as the area of the opening of the concave portion gradually increases in the straight upward direction. This also applies to the outer profile.

INDUSTRIAL APPLICABILITY

The present invention contributes to reduction in width and cost of backlight panels for LCD televisions by the light distribution controllers. Also, the light-emitting device according to the present invention can provide a broad light distribution characteristic also in general lighting applications, and thus the number of installed devices can be reduced, thereby enabling a reduction of the total number of parts.

DESCRIPTION OF REFERENCE CHARACTERS

10 Backlight Unit
20 Light Control Member
21 Diffuser Panel
22 Diffuser Sheet
23 First Prism Sheet
24 Second Prism Sheet
30 Planar Light Source Portion
100, 100x, 100y Light-Emitting Device
101 Semiconductor Light-Emitting Element (LED)
102 Package Substrate
103 Fluorescent Layer
104 Transparent Adhesive
110 Light Distribution Controller
111 First Optical Member
112 Second Optical Member
113 First Optical Member
201 ZnO Wafer
202 $SiO_2$ Film
203 Photoresist
1111 Outer Wall Surface
1112 First Concave Portion
1121 Outer Wall Surface
1122 Second Concave Portion
1123 Inner Wall Surface
1124 Flat Portion
1131 First Concave Portion
1132 Inner Wall Surface
1133 Upper Surface Portion
1134 Outer Wall Surface
D LCD Panel
M Center of LED
P Mount Substrate

The invention claimed is:

1. A light distribution controller, comprising:
a first optical member configured to cover a light source; and
a second optical member configured to cover the first optical member,
wherein
the first optical member has a shape of a circular truncated cone or of a prismoid which tapers from the light source, and has a first concave portion which is formed from an upper surface of the circular truncated cone or prismoid in a downward direction along a central axis of the circular truncated cone or prismoid,
the first concave portion has an opening whose area increases in an upward direction along the central axis,
light emitted from the light source has a Lambertian light distribution characteristic, and has a maximum light intensity in a direction along the central axis,
when outputting the light emitted from the light source toward the second optical member, the first optical member converts the light into light having a light distribution characteristic which has an annular peak of light intensity centered around the central axis,
the second optical member has a second concave portion formed along the central axis, the second concave portion having an opening whose area increases in an upward direction along the central axis, and
of the light having the light distribution characteristic incident from the first optical member upon the second optical member, light incident upon a surface forming the second concave portion is totally reflected at the surface.

2. The light distribution controller of claim 1, wherein the first optical member is formed of a material having a higher refractive index than that of the second optical member.

3. The light distribution controller of claim 2, wherein the first optical member is formed of zinc oxide crystals.

4. The light distribution controller of claim 3, wherein the first concave portion of the first optical member includes a surface formed of crystal planes including {10-11} crystal planes.

5. The light distribution controller of claim 2, wherein the first optical member is formed of a polymer containing nanoparticles.

6. A light-emitting device, comprising:
a semiconductor light-emitting element as a light source; and
the light distribution controller of claim 1 disposed over the semiconductor light-emitting element.

7. The light-emitting device of claim 6, wherein
a fluorescent layer containing a fluorescent material which emits light having a longer wavelength than a wavelength of light emitted from the semiconductor light-emitting element, the light having the longer wavelength emitted based on the light emitted from the semiconductor light-emitting element, is disposed between the semiconductor light-emitting element and the first optical member.

8. A method for fabricating a light distribution controller having a first optical member which covers a light source, and a second optical member which covers the first optical member, comprising steps of:
forming a plurality of masks, each of which occupies a region interposed between two concentric and axisymmetric regular hexagons, one of which is larger than the other, over an upper surface of a monocrystalline wafer of zinc oxide so that opposing sides of the masks immediately adjacent to each other are parallel to each other,
forming indentations having openings of regions between the masks immediately adjacent to each other and of the smaller regular hexagons inside the masks by removing portions not covered with the masks by anisotropically etching the upper surface of the monocrystalline wafer,
forming the first optical members which each are a regular hexagon as seen in a plan view by separating every two of the masks immediately adjacent to each other on the monocrystalline wafer, and
forming the second optical members by covering an upper surface side of each of the first optical members with encapsulation resin,
wherein
the step of forming the second optical members forms a second concave portion having an opening whose area increases in an upward direction, above each of first concave portions, which are the indentations having the openings of the smaller regular hexagons inside the masks.

9. The method for fabricating a light distribution controller of claim 8, wherein
a central axis extending upward passing through a center of the regular hexagon in each of the first concave portions passes through a center of a bottom of the corresponding one of the second concave portions.

* * * * *